United States Patent [19]

Silver et al.

[11] Patent Number: 5,942,997
[45] Date of Patent: Aug. 24, 1999

[54] CORRELATED SUPERCONDUCTOR SINGLE FLUX QUANTUM ANALOG-TO-DIGITAL CONVERTER

[75] Inventors: Arnold H. Silver, Rancho Palos Verdes; Dale J. Durand, Irvine, both of Calif.

[73] Assignee: TRW Inc., Redondo Beach, Calif.

[21] Appl. No.: 08/920,741

[22] Filed: Aug. 29, 1997

[51] Int. Cl.$^6$ .................................................. H03M 1/12
[52] U.S. Cl. ........................................... 341/133; 341/171
[58] Field of Search .................................. 341/133, 171, 341/155, 156

[56] References Cited

U.S. PATENT DOCUMENTS

| | | | |
|---|---|---|---|
| 4,879,488 | 11/1989 | Silver | 341/171 |
| 5,396,242 | 3/1995 | Lee | 341/133 |
| 5,858,373 | 10/1998 | Semenov et al. | 341/133 |

Primary Examiner—Marc S. Hoff
Assistant Examiner—Peguy JeanPierre
Attorney, Agent, or Firm—Michael S. Yatsko

[57] ABSTRACT

A correlated superconductor single flux quantum oscillator-counter analog-to-digital (A/D) converter has a superconducting quantum interference device (SQUID) quantizer 20 with two Josephson junctions 24 and 26, each connected to a digital sampling and counting circuit with synchronized timing to increase the sampling rate or the bit resolution of the A/D converter. In a preferred embodiment, a plurality of SQUID quantizers 60 . . . 72 each with two Josephson junctions 74 . . . 88 are connected to a counter structure with precisely synchronized timing to further increase the sampling frequency and/or the bit resolution. A counter structure preferably comprises multiple rows 218, 240, 254 of single flux quantum flip-flops 220 . . . 234, 242 . . . 248, 256, 258 and parallel-serial converter/shift registers 236 250, 260 to produce an output digital data stream in serial form.

19 Claims, 4 Drawing Sheets

CORRELATED SUPERCONDUCTOR SINGLE FLUX QUANTUM ANALOG-TO-DIGITAL CONVERTER

BACKGROUND

The present invention relates to a correlated superconductor single flux quantum analog-to-digital (A/D) converter, and in particular to a correlated single flux quantum A/D converter that quantizes an analog signal by multiple Josephson junctions of direct current (DC) superconducting quantum interference device (SQUID) quantizers.

There is a need for high performance and low power A/D converters to digitize high frequency analog signals for high speed signal processing applications such as in radar, communications, and sensor systems. Superconductor A/D converters have shown a potential to achieve superior performance at much lower power than many conventional integrated circuit-based A/D converters. At the present time, existing superconductor A/D converters are able to achieve a sampling speed of 10–25 million samples per second (MSps) with a resolution of 12–14 bits per sample. To achieve this performance range, however, the conventional circuit architecture of a superconductor A/D converter pushes the available superconductor junction and integrated circuit processing technology to the limit, especially for niobium (Nb), niobium nitride (NbN), and yttrium-barium-copper oxide (YBCO) superconductor integrated circuits. Exceeding the performance level of 25 MSps sampling speed and 14–16 bits per sample resolution is generally regarded to require extensive, very high speed digital signal processing which may not be feasible.

Many different A/D converter concepts have been proposed for superconductor implementation. These can be classified as:

(1) Fully parallel A/D converters which use $2^N$ Josephson junctions as threshold detectors for N bits. These junctions are connected to the analog signal by an analog divider such as an R-2R ladder.
(2) Analog folder A/D converters which use N SQUIDs to perform Gray code quantization to N bits. The N SQUIDs are connected to the analog signal by a binary divider network.
(3) Single flux quantum tracking A/D converters which use a single SQUID to establish all 2N threshold levels of an N-bit A/D converter. At each threshold crossing of the SQUID. the SQUID generates a single flux quantum (SFQ) pulse. A single flux quantum counter accumulates the SFQ pulses, which tracks the analog signal.
(4) Voltage-controlled oscillator—counter A/D converters which measure the frequency of a voltage controlled oscillator. The analog signal is connected to the voltage-controlled oscillator (VCO) whose frequency is controlled by the analog voltage.

An oscillator—counter superconductor A/D converter has a generic circuit diagram shown in FIG. 1. The circuit includes a SQUID quantizer 2 which comprises an inductor 4 and two Josephson junctions 6 and 8 in a symmetrically arranged loop. The Josephson junctions 6 and 8 each have an equivalent circuit shown in FIG. 1a, with a junction resistance $R_J$ and capacitance C connected in parallel with an ideal Josephson junction. Returning to FIG. 1, a current signal 10 is summed with a DC current supply 12, and the DC-biased current signal flows through a resistor R connected in parallel with the SQUID quantizer 2 to produce a voltage V across the SQUID quantizer. In response to the Voltage V, the Josephson junction 8 generates a series of SFQ pulses 14 having a pulse frequency that is directly proportional to V, with the relationship $$V = \Phi_o f$$

wherein $\Phi_o$ is a constant defined by h/2e, where h is Planck's constant and e is the magnitude of the charge of an electron. $\Phi_o$ is approximately equal to $2 \times 10^{-15}$ V·s. The pulses 14 are transmitted to an aperture gate 16, which is clocked to transmit or interrupt the SFQ pulses according to the sampling rate $F_s$. The aperture gate is connected to a single flux quantum counter 18, usually a chain of flip-flops, which operate asynchronously to accumulate the total number of pulses generated by the oscillator 2 and transmitted by the aperture gate 16 during each sampling interval. At the end of each sampling interval, the counter is "read-out" as an N-bit binary number and the counter is "reset" for the next sampling interval. The aperture gate and the counter read-out generally use synchronized clock signals from a common clock.

The performance of this generic superconductor A/D converter described above is limited in resolution N and sampling rate $F_s$ by $$F_{max} \geq 2^N F_s$$

wherein $F_{max}$ is the maximum SFQ frequency of the junction 8, N is the binary bit resolution, and $F_s$ is the sampling speed. Since N represents the number of bits per sample and the output data is in a binary form, $2^N$ represents the number of quantization levels per sample. The sampling rate $F_s$ must be more than twice the highest frequency of the analog signal bandwidth to be sampled according to the Nyquist Sampling Theorem. The SFQ frequency of the oscillator-quantizer 8 must be at least the number of quantization levels per sample times the sampling rate, that is, $2^N F_s$ to produce a digital output signal that adequately represents the input analog signal.

There is presently a need for a high performance and low power A/D converter at 20 MSps sampling rate and 20 bits per sample resolution for radar applications. Another application calls for an A/D converter with a sampling speed of 150 MSps and a resolution of 16 bits per sample, and yet other applications call for a sampling speed of 20 GHz with a resolution of 10 bits per sample. According to the above relation, all of these applications require Fmax≈$10^{13}$ Hz. Some applications in space and cryogenic sensor systems require low power consumption thereby necessitating the use of superconductor A/D converters.

Therefore, there is a need for a superconductor A/D converter that is able to achieve the performance of Fmax≧$10^{13}$ Hz, using existing superconductor integrated circuit processing technology.

Furthermore, a conventional superconductor oscillator-counter A/D converter has a single flux quantum binary ripple counter connected to only one of the two Josephson junctions of a DC SQUID quantizer. A fixed current is applied to the gate of the SQUID to set the SQUID in a voltage state. A low resistance shunt may be required to reduce thermally induced frequency fluctuations which set an intrinsic noise floor and limits corresponding size of the least significant bit (LSB), and to achieve a high linearity of the pulse frequency generated in response to the analog input signal. As described above, the pulse frequency of a Josephson junction is theoretically perfectly linear with the applied voltage with a relationship given by $V = \Phi_o f$. However, because of the non-linear current vs. voltage (I/V) characteristics of the basic DC SQUID, the frequency may not be sufficiently linear with respect to the analog input current, especially when the current is small, for example, when the current is near the junction critical current, which is the minimum current for activating the converter circuit.

Therefore, there is a further need for a superconductor A/D converter that is able to achieve an arbitrarily high linearity in converting an analog input signal to the frequency count of the single flux quantum oscillator.

Additionally, the small shunt resistor $R<<R_J$ (FIG. 1) reduces the sensitivity of the A/D converter to the analog signal current. Therefore there is a need to increase the sensitivity of the oscillator-counter A/D converter.

SUMMARY OF THE INVENTION

The present invention satisfies all these needs. In view of the above problems, the present invention provides a correlated single flux quantum A/D converter with a high sampling speed and a high bit resolution, and achieves a high level of linearity and sensitivity in analog-to-digital frequency conversion. In one embodiment, the superconductor single flux quantum oscillator-counter A/D converter generally comprises:

(a) a superconducting quantum interference device (SQUID) quantizer having at least one pair of Josephson junctions, the SQUID quantizer being connected to an input analog signal to coherently produce SFQ pulses from the analog signal by both Josephson junctions;

(b) at least one pair of coherently clocked single flux quantum aperture pulse gates connected to the respective pair of Josephson junctions to transmit pulses that represent quantized samples of the analog signal;

(c) at least one pair of single flux quantum flip-flops connected to the respective pair of pulse aperture gates, the flip-flops each producing a count of the pulses from the respective junction and pulse aperture gates; and (d) at least one asynchronous SFQ pulse combiner connected to combine the counts from the pair of flip-flops within a precise sampling interval, the combined counts forming an output SFQ pulse stream that represents the more significant bits of the analog signal.

(e) an SFQ flip-flop counter which encodes the SFQ pulse stream from the asynchronous SFQ pulse combiner.

In a preferred embodiment in which a plurality of the Josephson junctions of the SQUID quantizers are coherently connected to quantize the input analog signal and the counts from the junctions are summed within the same precise sampling interval, the A/D converter comprises:

(a) a plurality of Josephson junctions in a superconducting quantum interference device (SQUID) quantizer;
(i) a first row comprising a center-tapped inductor having the analog signal connected to the center of the inductor so as to divide the input current in equal amounts; and
(ii) at least one successive row comprising a plurality of paired inductors each having their center-tap connected to the ends of the center-tapped inductor in the preceding row;
(iii) a row of a plurality of Josephson junctions coherently connected in parallel in a SQUID to coherently quantize the analog signal.

(b) a plurality of pairs of coherently clocked single flux quantum pulse aperture gates connected to their respective pairs of Josephson junctions of the SQUID quantizers of the final row which generate pulses that represent quantized samples of the analog signal;

(c) a first row of a plurality of pairs of single flux quantum flip-flops connected to the respective pairs of pulse aperture gates, the flip-flops each producing a count of the pulses from the respective pulse aperture gate;

(d) a first row of a plurality of asynchronous SFQ pulse combiners each connected to combine the SFQ pulses transmitted by two flip-flops of the first row within a precise sampling interval;

(e) at least one successive row of additional single flux quantum flip-flops connected to the asynchronous SFQ pulse combiners of a preceding row;

(f) at least one successive row of additional asynchronous SFQ pulse combiners connected to combine the counts from two flip-flops of a preceding row; and (g) a final single flux quantum flip-flop counter connected to count the pulses from the preceding row of flip-flops to generate the output digital data that represents the analog signal.

In another preferred embodiment in which parallel-serial converter shift registers are added to generate a serial output data stream to represent the input analog signal, the A/D converter generally comprises:

(a) a plurality of Josephson junctions connected in parallel with each other in a SQUID, each SQUID having a signal terminal connected to receive the input analog signal and a ground terminal;

(b) a plurality of coherently clocked pulse aperture gates having a plurality of inputs connected to the respective signal terminals of the Josephson junctions and a plurality of outputs to transmit pulses that represent quantized samples of the analog signal;

(c) a first row of a plurality of single flux quantum flip-flops having a plurality of inputs connected to the respective pulse aperture gates, the flip-flops each having a carry to transmit the scaled pulse rate and a read-out to produce a count of the pulses from the respective pulse aperture gate;

(d) a first parallel-serial converter shift register having a plurality of inputs connected to the respective read-outs of a first row of flip-flops to convert the data from the flip-flops to a first set of serial data;

(e) at least one successive row of additional single flux quantum flip-flops each having two inputs connected to the outputs of two flip-flops of a preceding row, and a carry and a read-out to produce a combined count of pulses from the flip-flops of the preceding row;

(f) at least one additional parallel-serial converter shift register having a plurality of inputs connected to the respective read-outs of a preceding row of flip-flops to convert the data from the flip-flops to an additional set of serial data;

(g) an asynchronous SFQ pulse combiner connected to combine the counts of pulses from the preceding row of flip-flops to generate a final set of serial data; and (h) a plurality of single flux quantum flip-flops connected in series, including:
(i) a first serial flip-flop connected to receive the first set of serial data from the first parallel-serial converter shift register to generate the least significant bit of the output digital data stream; and
(ii) a plurality of additional serial flip-flops connected successively to receive the additional and final sets of serial data to generate the higher order bits of the output digital data stream.

Advantageously, the present invention provides an A/D converter with a frequency counter structure connected to each of the two Josephson junctions of the SQUID quantizer.

Compared with a single junction quantizer, the present invention either multiplies the clock frequency $F_c$ by a factor of two or increases the bit resolution N by one extra bit. If the A/D converter includes a plurality of coherently connected SQUID quantizers having a number of Josephson junctions J, the present invention results in either multiplication of the clock frequency $F_c$ by a factor J, or an increase in the bit resolution N by $\log_2 J$.

BRIEF DESCRIPTION OF THE DRAWINGS

These and other features, aspects, and advantages of the present invention will become understood with reference to the following description, appended claims, and accompanying drawings where:

DETAILED DESCRIPTION OF THE PREFERRED EMBODIMENTS

The present invention provides a superconductor correlated single flux quantum oscillator-counter analog-to-digital (A/D) converter with a circuit architecture that includes an SFQ pulse aperture gate and a single flux quantum counter connected to each of the two Josephson junctions of a superconducting quantum interference device (SQUID) quantizer. Specifically, a DC SQUID quantizer has two Josephson junctions which are coherently connected to the same precise voltage, and each junction produces precisely the same frequency. When the Josephson junctions are each connected to an aperture pulse gate and counter circuit, summing the counts from all of the junctions within the same precise sampling interval results in either an increase in the permissible sampling frequency of the A/D converter, or an increase in the available bit resolution. Depending upon the desired circuit configuration, the invention can be implemented with a variety of embodiments. Detailed descriptions of several embodiments of the present invention are described as follows:

1. Embodiment A

Figure 1:
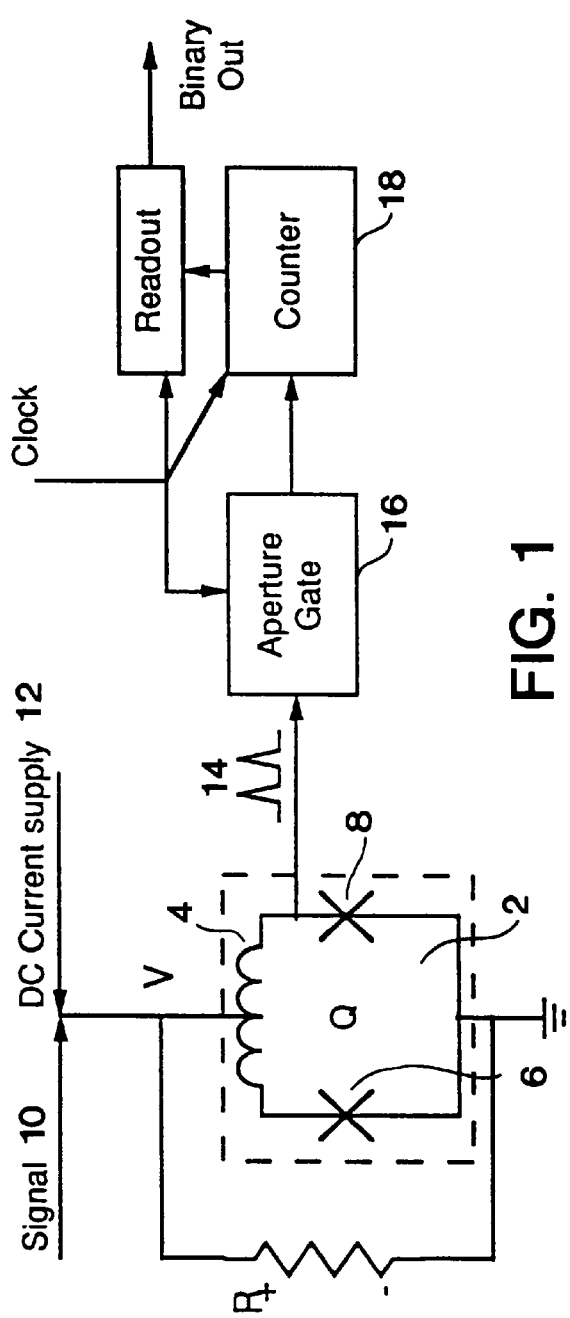
FIG. 1, described above, is a circuit diagram of a conventional superconductor single flux quantum oscillator-counter A/D converter.
Figure 1A:
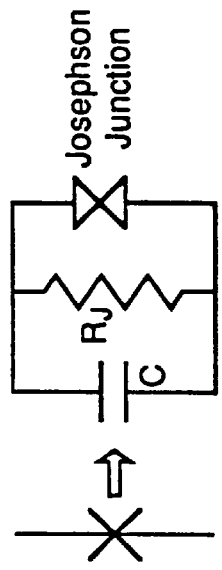
FIG. 1a, described above, is an equivalent circuit of a Josephson junction.
Figure 2:
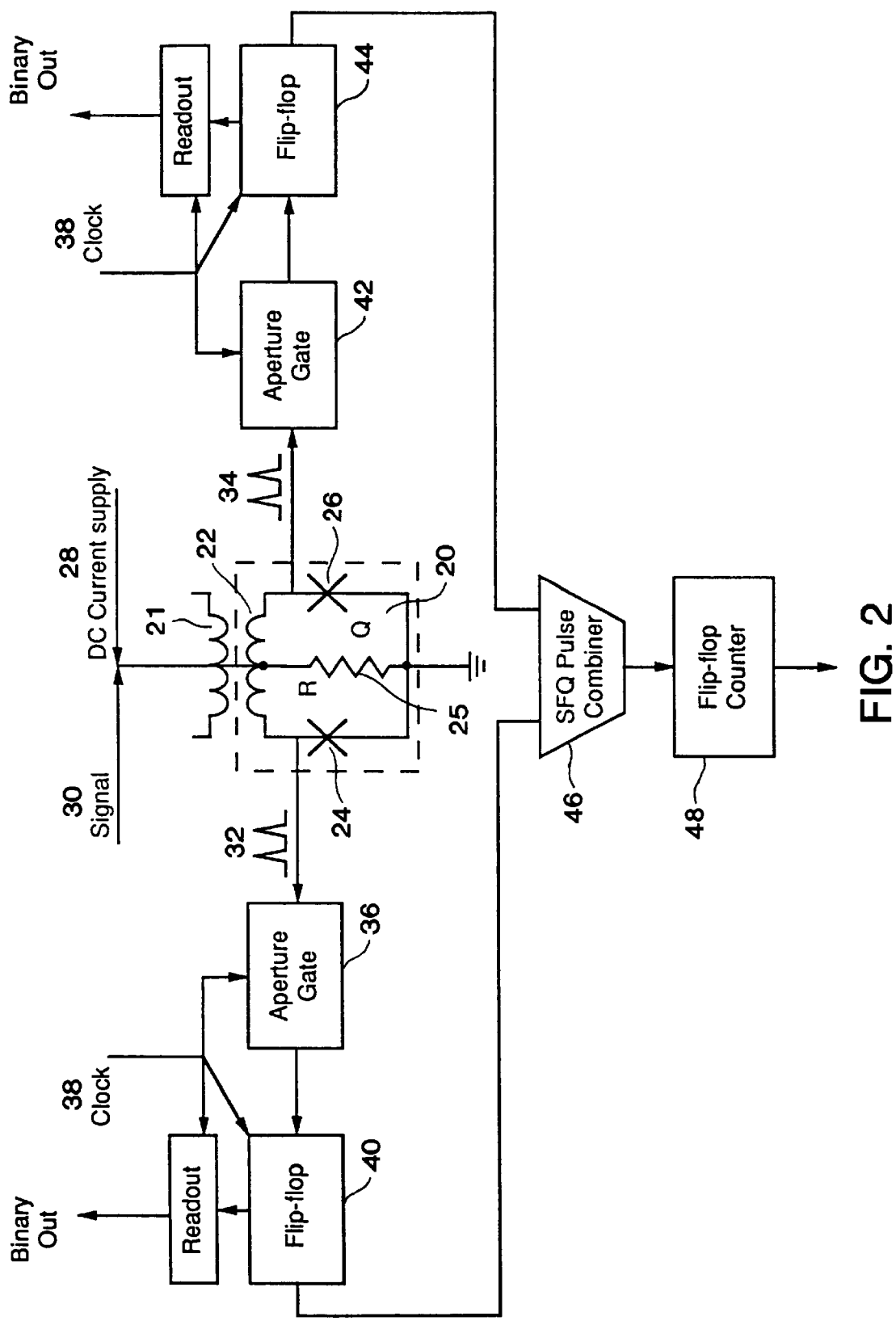
FIG. 2 is a circuit diagram of a correlated superconductor single flux quantum A/D converter in accordance with the present invention.

FIG. 2 shows a correlated superconductor single flux quantum A/D converter with a single SQUID quantizer 20 in accordance with the present invention. The SQUID quantizer 20 is preferably a conventional two-junction DC SQUID quantizer. The circuit of a DC SQUID quantizer comprises an inductor 22 having two ends connected to two Josephson junctions 24 and 26, respectively. The ends of the Josephson junctions 24 and 26 opposite the inductor 22 are connected to ground. The DC SQUID quantizer 20 is set in an operating voltage state with a DC bias current 28 provided by a DC current supply, which is connected to the inductor 22. An analog input current signal 30 is biased by the DC current 28, and the DC-biased current signal is supplied to the inductor 22 of the DC SQUID quantizer 20. The Josephson junctions 24 and 26 each have an equivalent circuit as shown in FIG. 1a, with an ideal Josephson junction connected in parallel with a junction resistance $R_J$ and capacitance C. Furthermore, an additional resistance R, 25, (FIG. 2) is connected across the SQUID 20 as shown in FIG. 2. R which has a lower ohmic value than $R_J$ ensures that the I/V characteristics of the SQUID are single-valued and sets the internal noise floor of the oscillator frequency. The DC-biased current signal flowing through R produces a voltage across the Josephson junctions, which in response produce single flux quantum pulses with a pulse frequency directly proportional to the voltage across the Josephson junction according to the relationship $V=\Phi_o f$ as described above. The Josephson junctions 24 and 26 generate output pulse streams 32 and 34, respectively. The pulses 32 and 34 generated by the two Josephson junctions 24 and 26 of a single DC SQUID quantizer 20 are identical to and phase coherent with each other.

Inductor 21 is magnetically coupled to the SQUID inductor 22 with a mutual inductance M. A current $I_{cc}$ is connected across the two terminals of 21 and produces a magnetic flux $MI_{cc}$ in SQUID 20. According to the well-known properties of SQUIDs, this will produce a relative shift in the phase of the two junctions, and thereby in the relative phase of the pulse stream 34 relative to that of 32 of $\Delta\theta=2\pi MI_{cc}/\Phi_o$.

The output pulses 32 from the first Josephson junction 24 are transmitted to an aperture gate 36, also called a pulse aperture gate. The aperture gate 36 is controlled by a precise timing signal 38 with a precise frequency and phase so that the timing signal accurately provides a window to transmit the pulses 32 by the gate 36. The aperture gate 36 has an output connected to a single flux quantum flip-flop (FF) 40, which is also preferably controlled by the same timing signal 38. It is important that the FF 40 at the end of the aperture gate 36 be readout and reset by the same timing signal 38 to generate an accurate count of the pulses 32. The output pulses 34 from the Josephson junction 26 are transmitted to a frequency counter architecture in the same manner as that for the Josephson junction 24. An aperture gate 42 is connected to receive the pulses 34 and has an output connected to a single flux quantum FF 44. It is important that the aperture gate 42 and the FF 44 count the pulses 34 in synchronization with the aperture gate 36 and the FF 40, respectively. It is preferred that the aperture gate 42 and the counter 44 be controlled by the same timing signal 38 that also controls the aperture gate 36 and a counter 40. It is further preferred that a single clock be used to control the aperture gate 36 and 42 and the FF 40 and 44, with the clock being connected to all four components through superconducting lines with an equal electrical line length. The FFs 40 and 44 are preferably asynchronous flip-flops, and in a superconductor integrated circuit, it is preferred that the counters be single flux quantum flip-flops. The outputs from the counters 40 and 44 are connected to an SFQ pulse combiner gate 46, which is preferably a lossless wired asynchronous OR gate to combine the carry outputs of the FFs 40 and 44. The SFQ pulse combiner gate 46 generates a combined output to a third counter 48, which is preferably also a single flux quantum flip-flop, to generate a combined count of the pulses 32 and 34 from both Josephson junctions 24 and 26.

Since the superconducting interconnections have no voltage drop, both Josephson junctions 24 and 26 connected in this manner oscillate at precisely the same frequency and the output pulses 32 and 34 are phase coherent. The FF counters 40 and 44 count the pulses from both Josephson junctions during the same sampling interval and the flip-flop counter 48 combines the counts of the pulses. An important advantage of this embodiment is that with the same junction frequency $f=V/\Phi_o$, the effective maximum frequency $F_{max}$ is multiplied by a factor of 2, thereby resulting in a clock speed increase of 100%. Alternatively, this embodiment increases the bit revolution by 1 extra bit if the sampling frequency remains the same as in a N conventional A/D converter. Therefore, the previous of limit of $F_{max} \leq 2^N F_c$ set by the technology of a conventional superconductor oscillator-counter A/D converter circuit is no longer applicable. The present invention increases either the sampling rate or the bit resolution without the need to push the limit on superconductor integrated circuits fabrication technology. The circuit of FIG. 2 is the basic building block for an A/D converter having multiple DC SQUID quantizers with further increases in the sampling frequency or the bit resolution, described in embodiment B and C below.

Another advantage of the present invention is the high linearity of analog to digital conversion. As shown in FIG. 2, a fixed DC current is applied to set the SQUID quantizer in a voltage state. Compared to the conventional oscillator-counter A/D converter of FIG. 1, the circuit of FIG. 2 in accordance with the present invention has a counter structure connected to each of the two Josephson junctions to shunt the SQUID quantizer, thereby achieving an arbitrarily high linearity of converting the voltage amplitude of the input signal to the pulse frequency. Therefore, the digital output from the counters is an accurate digital representation of the input signal.

2. Embodiment B

The concept of connecting synchronized counter structures to both Josephson junctions of a SQUID quantizer as shown in FIG. 2 and described in Embodiment A above can be expanded to a superconductor A/D converter architecture with multiple SQUID quantizers. Multiple pulse gates 42 and 46 are clocked to synchronously receive pulses from respective Josephson junctions. To ensure that the input analog current signal arrives at the SQUIDs simultaneously, a plurality of rows of DC SQUID quantizers are preferably connected to divide the input signal current equally among the Josephson junctions to which the pulse gates are directly connected.

Figure 3:
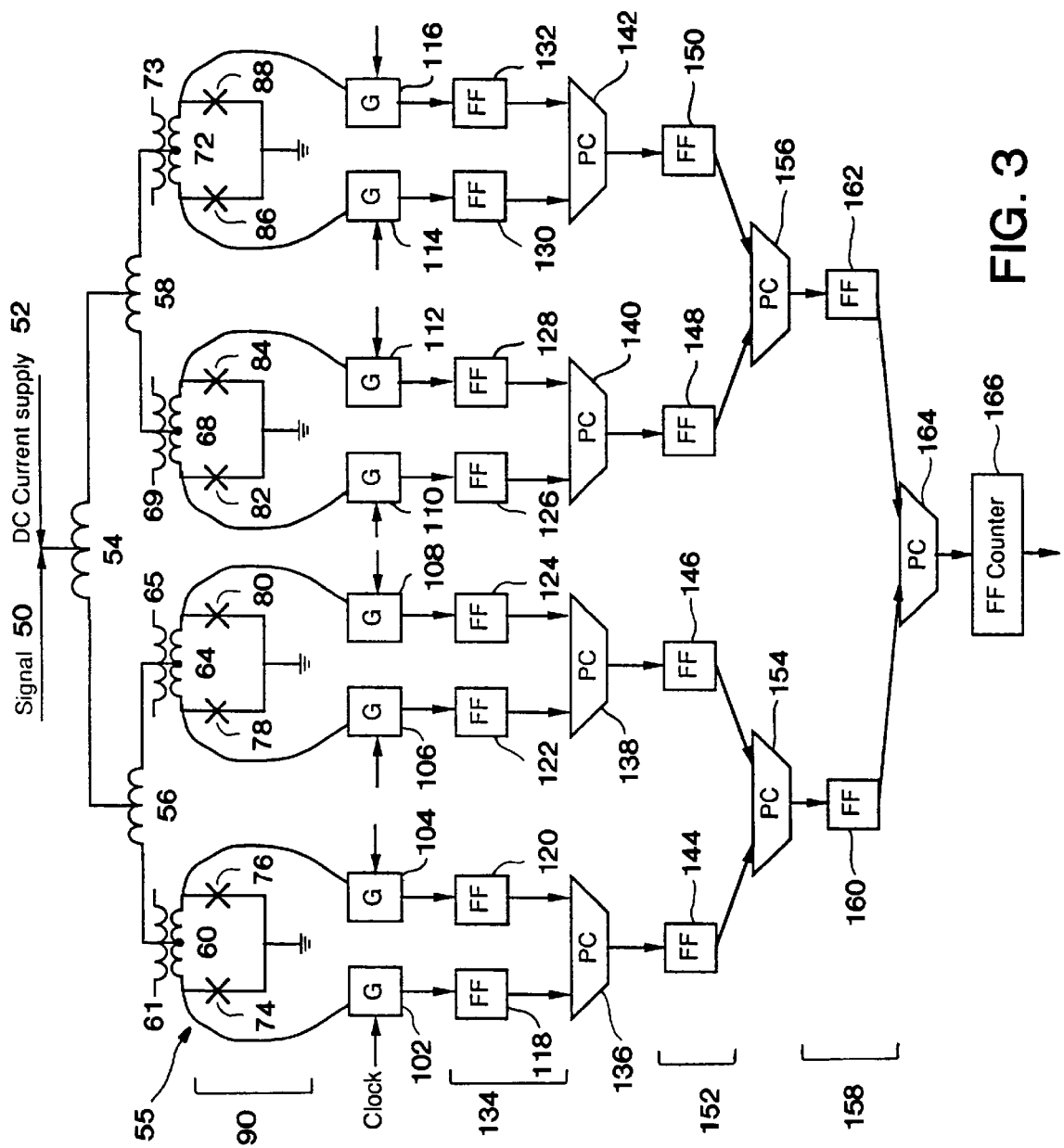
FIG. 3 is a circuit diagram of a preferred embodiment of the present invention, with a plurality of junction quantizers and a plurality of pairs of synchronized pulse gates.

FIG. 3 shows an example of this embodiment according to the present invention, with eight single flux quantum pulse gates arranged in pairs. An input analog current signal 50 is biased by a DC current 52, and the DC-biased current signal is supplied to the center-tap of a single superconducting inductor 54. The inductor 54 has two terminals which are connected to the center-tap of inductors 56 and 58 in the next row of inductors. The four terminals of the inductors 56 and 58 are connected to the center-tap of the inductors 60, 64, 68, and 72 which connect to the eight junctions 74, 76, 78, 80, 82, 84, 86, and 88 of the four SQUID quantizers in the row 90 as shown in FIG. 3. The resistor R of FIGS. 1 and 2 are implied for each quantizer SQUID, and/or are distributed symmetrically to ground in the inductor network 54, 56, and 58.

An array of pulse gates 102, 104, 106, 108, 110, 112, 114, and 116 are connected to receive pulses generated from the Josephson junctions 74, 76, 78, 80, 82, 84, 86 and 88, respectively, of the row of four SQUID quantizers 90. The number of junctions and pulse gates in the A/D converter circuit is preferably $2^N$, wherein N is a positive integer greater than or equal to 1. For a circuit with $2^N$ pulse gates, there are preferably N rows of input inductors, with each successive row of inductors having twice the number of inductors as its immediately preceding row. For example, in the A/D converter circuit of FIG. 3 with eight junctions and pulse gates, three rows 54, 55, and 59 of inductors are provided in a binary pyramid structure to divide the input current signal equally for each pulse gate over an equal electrical line length. The third row 59 include the inductors 60, 64, 68, and 72 of the SQUIDs 90. The pyramid row structure of SQUID quantizers includes a first row of a single inductor and a second row of two inductors. It is preferred that the pulse gates be synchronized by the same timing signal to gate the pulses, and it is further preferred that the timing signal be provided by a common clock connected to the pulse gates at an equal electrical line length. Furthermore, each SQUID inductor 60, 64, 68, and 72 is inductively coupled to another inductor 61, 65, 69, and 73, respectively, to provide a phase offset of the SFQ pulse trains from the various junctions. It is desirable that a common current be applied to each of the inductors 61, 65, 69, and 73.

The outputs of the pulse gates 102, 104, 106, 108, 110, 112, 114 and 116 are connected to respective single flux quantum flip-flops 118, 120, 122, 124, 126, 128, 130, and 132, respectively. The flip-flops function as counters to count the number of pulses from the respective pulse gates. The flip-flops are grouped in four pairs, with each pair connected to count the pulses generated by two Josephson junctions of the respective DC SQUID quantizers in the final row 90. The eight flip-flops 118, 120, 122, 124, 126, 128, 130, and 132 are directly connected to the respective pulse gates from a first row 134 of flip-flops. Each pair of flip-flops has outputs combined in a sub-array of SFQ pulse combiner gates, which is preferably a lossless wired OR gate. SFQ pulse combiner gates 136, 138, 140 and 142 are connected to combine the outputs of the flip-flop pairs, 118 and 120, 122 and 124, 126 and 128, and 130 and 132, respectively. The outputs of these SFQ pulse combiner gates are connected to flip-flops 144, 146, 148, and 150, respectively, in a second row 152 of flip-flops. The counter outputs of the flip-flops 144 and 146 are combined in a second sub-array of SFQ pulse combiner gates. Pulse combiner gates 154 and 156, receive the counter outputs of flip-flops 148 and 150 and are combined in the other SFQ pulse combiner gate 156. A third series of counters (flip-flops) 160 and 162 in a third row 158 are connected to the outputs of the SFQ pulse combiner gates 154 and 156, respectively, to produce combined counts from the SFQ pulse combiner gates. A final SFQ pulse combiner gate 164 is connected to combine the outputs of flip-flops 160 and 162, and is connected to a final single flux quantum binary counter 166, which completes the count representing a combination of all counts of Josephson junction pulses from the row 90 of DC SQUID quantizers. In this embodiment, each successive row of flip-flops has half the number of flip-flops in its immediately preceding row. It is preferred that the flip-flops in each row be synchronously timed to reset and to count the number of pulses received from the respective gates simultaneously. The SFQ pulse combiner gates are preferably lossless wired OR gates which do not require clock control. The total number of counts accumulated during a sampling interval is the sum of all the readouts of the first row of FFs 134, added to 2 times the sum of all the readouts of the row 152, added to $2^2$ times the readouts of the row 158, added to $2^2$ the binary number in the final counter 166.

An important advantage of this embodiment is that the previous limit of $F_{max} \leq 2^N F_s$, set by the conventional superconductor oscillator-counter A/D converter technology is increased by a factor J, which represents the number of Josephson junctions that are directly connected to the analog signal and clocked pulse gates. This results in either a multiplication of the sampling frequency, $F_c$ by a factor J, or an increase in the bit resolution N by $\log_2 J$. In the example illustrated in FIG. 3 and described above, there are four DC SQUID quantizers each having two Josephson junctions connected to the respective pulse gates. Eight Josephson junctions and eight corresponding clocked pulse gates result in a factor J of 8. Depending on the application and the desired performance, the A/D converter circuit of FIG. 3 enables either a sampling frequency that is 8 times the sampling frequency of a conventional superconductor oscillator-counter A/D converter circuit, or an increase of 3 bits over the bit resolution of a conventional superconductor oscillator-counter A/D converter circuit.

This embodiment in accordance with the present invention is not limited to the circuit shown in FIG. 3; other number of junctions are also feasible. For example, with 8 DC SQUID quantizers in the final row, there are 16 Josephson junctions directly connected to 16 simultaneously clocked pulse gates. The 16-junction A/D converter circuit either multiplies the maximum sampling frequency 16 times, or increases the bit resolution by 4 extra bits. Depending on the desired application, increases in both the sampling frequency and the bit resolution can be simultaneously achieved. For example, an 8-junction A/D converter can multiply the maximum sampling frequency by the factor of 2 and increase the bit resolution by 2 extra bits. As another example, a 16-junction A/D converter can multiply the sampling frequency by a factor of 4 and increase the bit resolution by 2 extra bits.

Another advantage of this embodiment is that all of the Josephson junctions are heavy shunted in a manner similar to embodiment A described above, thereby achieving a high linearity of voltage to frequency conversion by the Josephson junctions. Therefore, the A/D converter circuit of this embodiment produces a digital output that is an accurate representation of the input analog signal.

3. Embodiment C

Yet another embodiment of the present invention includes a plurality of parallel-serial converter/shift registers to perform accumulated counting of the data of the flip-flops and to generate a digital output data stream in a serial format, preferably from the least significant bit (LSB) to the most significant bit (MSB.).

Figure 4:
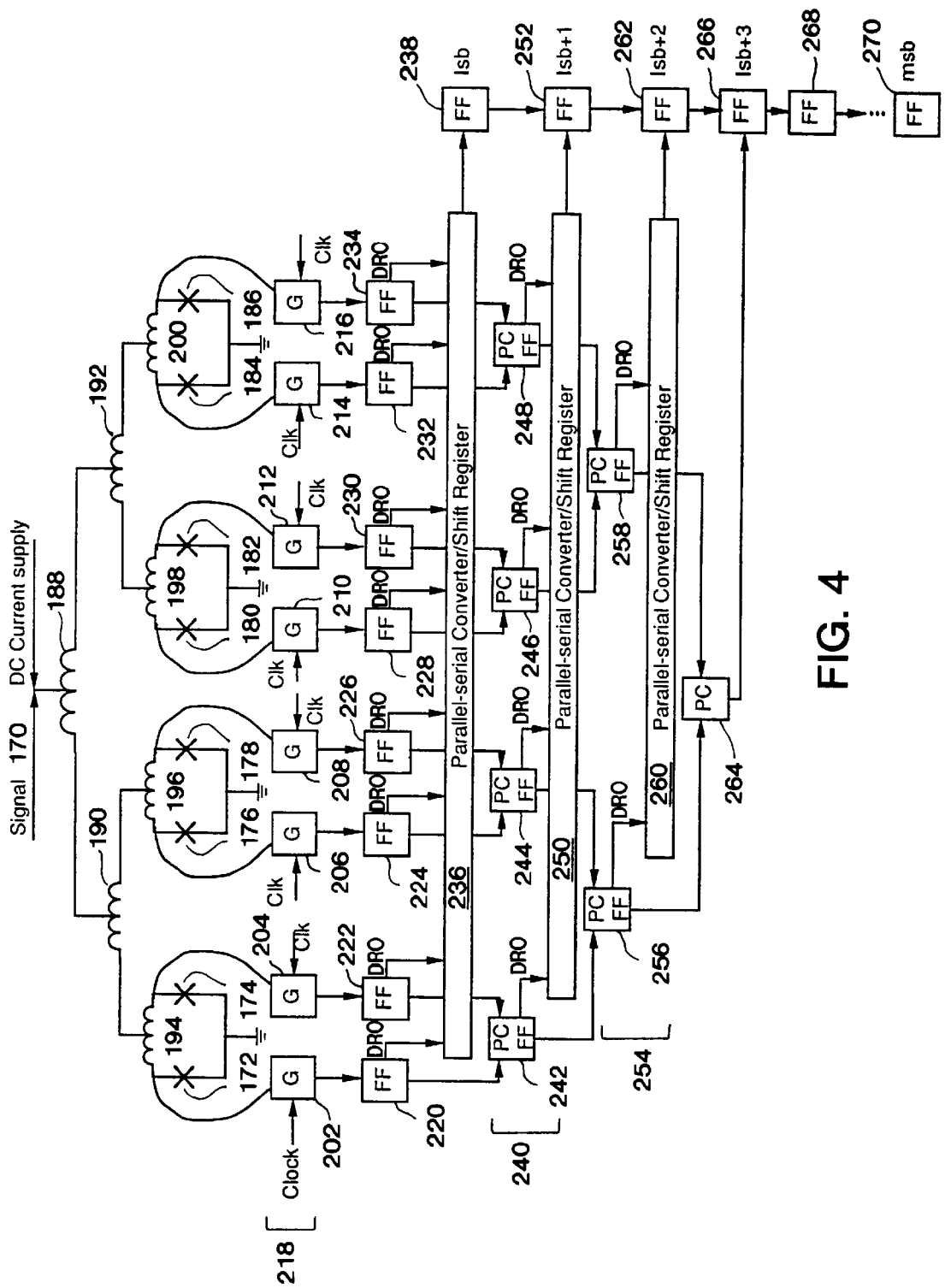
FIG. 4 is a circuit diagram of another preferred embodiment of the present invention, with a plurality of parallel-serial converter/shift registers to generate a digital output in serial form.

In an illustrative example shown in FIG. 4, a DC-biased input current signal 170 is supplied to a plurality of Josephson junctions 172, 174, 176, 178, 180, 182, 184, and 186, connected through a pyramid of superconducting inductors 188, 190, 192, 194, 196, 198 and 200. The Josephson junctions each have one end connected to one of the superconducting inductors to which the DC-biased input signal is supplied and another end connected to ground. Each Josephson junction has an equivalent circuit as shown in FIG. 1a, with a junction resistance $R_J$ in parallel with an ideal Josephson junction, and each SQUID has a resistor producing a voltage from the input current signal and the ideal Josephson junction producing a series of pulses with a pulse frequency that is directly proportional to the voltage. Each SQUID is also phase biased with a transformer as in FIG. 3.

The pulses from the Josephson junctions 172, 174, ... 186 are transmitted to a plurality of single flux quantum pulse gates 202, 204, ... 216, respectively. The pulse gates each have a clocked input connected to receive a timing signal, and the timing signals for all of the pulse gates are preferably synchronized so that the gating of the pulses from the respective Josephson junctions are coherently controlled. The pulse gates 202, 204, ... 216 are connected to a first row 218 of single flux quantum flip-flops 220, 222, ... 234, respectively, each of which generates a count of the pulses from its corresponding pulse gate. The flip-flops in the first-row 218 each have two outputs. One is the carry pulse which is transmitted to the following SFQ pulse combiner and flip-flop (PC/FF). The other one is connected to a destructive readout (DRO) gate which operates at the end of each clock period.

The multiplicity of DRO gates are connected to the first parallel-serial converter/shift register 236. The first parallel-serial converter/shift register 236 has the same number of inputs as the number of flip-flops in the first row, each input connected to an output of a respective flip-flop DRO in the first row. A bank of memory registers in the first parallel-serial converter/shift register 236 temporarily stores the data generated by the flip-flops of the first row. The first parallel-serial converter/shift register 236 has a single output that is connected to a first serial flip-flop 238. At the end of each clock period the FFs 218 are read and reset via the DRO gates. Immediately after the data is read into 236, it is rapidly clocked through the shift register to the FF 238 which is the first in an asynchronous FF counter 238, 252, 262, 266, 268, ... 270. This performs a bit-serial addition of the data in 236. Because the output from the first row 218 of flip-flops is a direct count of pulses from the individual Josephson junction oscillators without any combination, the bits stored in the shift register 236 and serially counted by FF 238 represent the LSB of the digital output of the A/D converter. The data in 238 at the end of this addition is the LSB of the digital output. In order for the A/D converter circuit to measure the smallest detectable input analog signal, the LSB is preferably set to represent the amplitude of the noise floor.

A second row 240 of single flux quantum flip-flops 242, 244, ... 248 each have an SFQ pulse combiner which has two inputs connected to the carry outputs of two adjacent flip-flops of the first row 218. As a result, each flip-flop in the second row 240 combines the carry counts produced by the two flip-flops of the first row 218 to which it is connected. The number of flip-flops in the second row is one-half the number of flip-flops in the first row. The DRO outputs of the second row 240 of flip-flops are connected to a second parallel-serial converter/shift register 250 which has the same number of inputs as the number of flip-flops in the second row. The shift register 250 has a bank of memory registers that temporarily stores the outputs from the flip-flops 242 ... 248 and transfers these outputs serially to the second serial single flux quantum flip-flop 252. The FF 252 and its successive FFs 262, 266, 268, and 270 perform bit-serial addition of the data in 250. The second serial flip-flop 252 represents a binary digit of the A/D converter output that is one bit higher than the LSB.

Additional single flux quantum flip-flops 256, 258 are arranged in a third row 254 and are each connected to combine a counter carry output of two adjacent flip-flops of the second row 240. A third parallel-serial converter/shift register 260 converts the DRO output of the third row of flip-flops into a serial form, stores the outputs in memory registers and transfers them to the third serial single flux quantum flip-flop 262. FFs 262, 266, 268, and 270 similarly performs bit-serial addition of the data in 260. The flip-flop 262 represents a binary digit of the A/D converter output that is two bits higher than the LSB. Depending on the number of Josephson junctions in the A/D converter circuit, additional rows of single flux quantum flip-flops and additional parallel-serial converter/shift registers can be added, with each successive row of flip-flops having half the number of flip-flops in its immediately preceding row. The flip-flops of each successive row are connected to combine the carry outputs of two adjacent flip-flops of its preceding row. For an A/D converter with J Josephson junctions, the number of parallel-serial converters/shift registers is equal to $\log_2 J$, which is the same as the number of rows of flip-flops. The next significant bit of the A/D converter output is generated by combining the carry output of the final row of two flip-flops in an SFQ pulse combining gate 264, which is connected to a serial single flux quantum flip-flop 266 that represents the next significant bit (LSB+3) of the digital output. Serial flip-flops 238, 252, 262, 266, . . . 270 are connected in series, such that the DRO output of this FF chain is the digital representation of the analog signal.

An advantage of this embodiment, in addition to the advantages described in Embodiments A and B above, is that the parallel-serial converter/shift registers 236, 250, and 260 coupled to the FFs 238, 252, 262, 266, . . . 270 enable bit-serial addition of the data generated by the respective rows of flip-flops which provides pure binary encoding of all the data. A further advantage of the multiple junction approach in this embodiment is that it requires a smaller analog signal. Because of the small dynamic shunt resistance required to reduce the noise in the quantizer frequency, only a small fraction of the input signal current is applied to each Josephson junction once it is placed in an operating voltage state. For a given level of performance, using multiple Josephson junctions in an A/D converter reduces the amplitude of the required analog signal in direct proportion to the number of junctions employed.

In a two-junction DC SQUID implementation, a magnetic flux of $\Phi_o/2$ is applied to the SQUID to ensure that the pulses at the two Josephson junctions of the SQUID quantizer are staggered by one-half period of the pulse frequency. This pulse staggering scheme is preferred because it prevents pulse collision errors when the pulses are combined. At the end of a sampling interval, the lowest bits, called LEFT and RIGHT, are stored in a pair of flip-flops connected to the two Josephson junctions by two aperture gates, and the higher order bits are stored in the flip-flops of the subsequent row. The first serial flip-flop, which represents the LSB, initially has no data. The flip-flops LEFT and RIGHT are connected to a 2-bit shift register in the first parallel-serial converter/shift register, and the binary data from the shift register are transferred to the first serial flip-flop. This produces the results shown in Table 1 below.

TABLE 1

TRUTH TABLE FOR TWO JUNCTIONS

| LEFT/RIGHT | 0 | 1 |
|---|---|---|
| 0 | 0,0=0 | 0,1=1 |
| 1 | 1,0=1 | 1,1=2= 0+carry |

After the carry has propagated through the FFs and the DRO data has propagated through the shift registers, a full sum count of the two junctions is produced.

This invention is applicable to a superconductor single flux quantum device because the DC SQUID quantizer, the single flux quantum flip-flops and the shift registers can all operate at the same high speed, for example, on the order of about 100 GHz. Although the basic building block of the present invention is a coherent frequency counting architecture for both Josephson junctions of a DC SQUID quantizer, it is preferred that more than one DC SQUID quantizer be used to further increase the sampling frequency, the bit resolution, or the sensitivity of the A/D converter.

Although the present invention has been described in considerable detail with reference to certain preferred versions thereof, other versions are possible. It is intended to cover all modifications, alternatives and equivalents which may fall within the spirit and scope of the invention as defined in the appended claims.

What is claimed is:

1. A superconductor single flux quantum analog-to-digital converter, comprising:
    (a) at least one superconducting quantum interference device (SQUID) quantizer having a pair of Josephson junctions, the SQUID quantizer being connected to a dc bias current which places the SQUID in the voltage state, and an input analog signal to coherently quantize the analog signal as an SFQ pulse rate by both Josephson junctions;
    (b) at least one pair of coherently clocked single flux quantum pulse gates connected to the respective pair of Josephson junctions to transmit pulses that represent quantized samples of the analog signal;
    (c) at least one pair of single flux quantum flip-flops connected to the respective pair of pulse gates, the flip-flops each producing a count of the pulses from the respective pulse gate; and
    (d) at least one SFQ pulse combining gate connected to combine the counts from the pair of flip-flops within a precise sampling interval, the combined counts forming an output digital data stream that represents the analog signal.

2. The superconductor single flux quantum analog-to-digital converter of claim 1, wherein the SFQ pulse combining gate comprises a substantially lossless wired OR gate.

3. The superconductor single flux quantum analog-to-digital converter of claim 1, wherein the pulse gates each comprise a clock input connected to receive a clock signal, and the clock signals for all of the pulse gates are synchronized to coherently clock the pulse gates.

4. The superconductor single flux quantum analog-to-digital converter of claim 3, further comprising a clock connected to the clock inputs of all of the pulse gates at equal times.

5. The superconductor single flux quantum analog-to-digital converter of claim 1, wherein the SQUID quantizers each comprise a magnetically coupled direct current (DC) SQUID.

6. The superconductor single flux quantum analog-to-digital converter of claim 1, wherein the SFQ pulse combining gates are connected to the respective pair of flip-flop outputs, the SFQ pulse combining gates including a final SFQ pulse combining gate connected to combine the counts from all of the flip-flops, the analog-to-digital converter further comprising a final single flux quantum flip-flop connected to the final SFQ pulse combining gate to generate a combined count that forms the output digital data stream.

7. The superconductor single flux quantum analog-to-digital converter of claim 1, the analog-to-digital converter further comprising:
    (a) a plurality of parallel-serial converter shift registers each connected to at least some of the plurality of flip-flops to generate one bit of the output; and
    (b) a plurality of serial single flux quantum flip-flops each connected to one of the shift registers to count a respective bit, the serial flip-flops connected to generate the output digital data stream in a serial form.

8. The superconductor single flux quantum analog-to-digital converter of claim 7, wherein the serial flip-flops are connected in series in a sequential order and include first and last serial flip-flops to represent the least significant bit and the most significant bit of the digital output data stream, respectively.

9. The superconductor single flux quantum analog-to-digital converter of claim 7, wherein the plurality of flip-flops are arranged in rows, each row of flip-flops connected to a respective one of the shift registers in a sequential order, each flip-flop of a successive row having two inputs connected to outputs of two flip-flops of its immediately preceding row, and each successive row having one half the number of flip-flops of its immediately preceding row.

10. A superconductor single flux quantum (SFQ) analog-to-digital converter, comprising:
(a) a plurality of superconductive inductors arranged in a plurality of rows including:
 (i) a first row comprising an inductor having a signal input connected to receive an analog signal; and
 (ii) a second row comprising a plurality of inductors having an input connected to a terminal of inductors of said first row;
(b) a pyramid array of SQUID quantizers including Josephson junctions, each row of said inductors connected to the Josephson junctions;
(c) an array of pulse gates connected to receive pulses generated by the Josephson junctions from the pyramid array of SQUID quantizers including a first series of counters connected to said pulse gates to count the pulses from the respective pulse gates;
(d) a sub-array of pulse combiner gates connected to the output of the first series of counters;
(e) a second series of counters combined with a second sub-array of pulse combiner gates;
(f) a third series of counters connected to the output of the second sub-array of pulse combiner gates to produce combined counts; and
(g) a final single SFQ pulse combiner gate for combining the outputs of the third array of counters and is connected to an SFQ counter to complete the count representing the combination of all counts of Josephson junction pulses.

11. The superconductor single flux quantum analog-to-digital converter of claim 10, wherein each successive row of inductors has twice the number of inductors of its immediately preceding row.

12. The superconductor single flux quantum analog-to-digital converter of claim 11 comprising N rows of inductors, wherein the final row of inductors is coupled to $2^N$ coherent junction oscillators, and the first row of flip-flops comprises $2^N$ flip-flops.

13. The superconductor single flux quantum analog-to-digital converter of claim 10, wherein each successive row of single flux quantum flip-flops has one half the number of flip-flops of its immediately preceding row.

14. The superconductor single flux quantum analog-to-digital converter of claim 10, wherein the SQUID quantizers each comprise a magnetically coupled direct current (DC) SQUID.

15. The superconductor single flux quantum analog-to-digital converter of claim 10, wherein the pulse gates each comprise a clock input connected to receive a clock signal, and the clock signals for all of the pulse gates are synchronized to coherently clock the pulse gates.

16. A superconductor single flux quantum analog-to-digital converter for converting an input analog signal to an output digital data stream that includes a least significant bit and higher order bits, comprising:
(a) a plurality of Josephson junctions connected in parallel with each other, each Josephson junction having a signal terminal connected to receive the input analog signal and a ground terminal;
(b) a plurality of coherently clocked pulse gates having a plurality of inputs connected to the respective signal terminals of the Josephson junctions and a plurality of outputs to generate pulses that represent quantized samples of the analog signal;
(c) a first row of a plurality of single flux quantum flip-flops having a plurality of inputs connected to the respective pulse gates, the flip-flops each having an output to produce a count of the pulses from the respective pulse gate;
(d) a first parallel-serial converter shift register having a plurality of inputs connected to the respective outputs of the readout of the first row of flip-flops to convert the data from the flip-flops to a first set of serial data;
(e) at least one successive row of additional single flux quantum flip-flops each having two inputs connected to the outputs of two flip-flops of a preceding row, and an output to produce a combined count of pulses from the flip-flops of the preceding row;
(f) at least one additional parallel-serial converter shift register having a plurality of inputs connected to the respective outputs of the readout of a preceding row of flip-flops to convert the data from the flip-flops to an additional set of serial data;
(g) a pulse combining gate connected to combine the counts of pulses from the preceding row of flip-flops to generate a final set of serial data; and
(h) a plurality of single flux quantum flip-flops connected in series, including:
 (i) a first serial flip-flop connected to receive the first set of serial data from the first parallel-serial converter shift register to generate the least significant bit of the output digital data stream; and
 (ii) a plurality of additional serial flip-flops connected successively to receive the additional and final sets of serial data to generate the higher order bits of the output digital data stream.

17. The superconductor single flux quantum analog-to-digital converter of claim 16, wherein each successive row of flip-flops have half the number of flip-flops of its immediately preceding row.

18. The superconductor single flux quantum analog-to-digital converter of claim 17, wherein the pulse gates each comprise a clock input connected to receive a clock signal, and the clock signals for all of the pulse gates are synchronized to coherently clock the pulse gates.

19. The superconductor single flux quantum analog-to-digital converter of claim 16, further comprising a plurality of superconducting inductors to which the signal terminals of the Josephson junctions are connected, each pair of the Josephson junctions connected by one of the inductors to form a SQUID quantizer.

* * * * *